(12) United States Patent
Young et al.

(10) Patent No.: US 11,750,195 B2
(45) Date of Patent: Sep. 5, 2023

(54) COMPUTE DATAFLOW ARCHITECTURE

(71) Applicant: XILINX, INC., San Jose, CA (US)

(72) Inventors: Steven P. Young, Boulder, CO (US);
Brian C. Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/876,456

(22) Filed: Jul. 28, 2022

(65) Prior Publication Data
US 2022/0368330 A1 Nov. 17, 2022

Related U.S. Application Data

(62) Division of application No. 16/857,090, filed on Apr. 23, 2020, now Pat. No. 11,451,230.

(51) Int. Cl.
*H03K 19/17748* (2020.01)
*G06F 1/10* (2006.01)
*G06F 8/40* (2018.01)
*H03K 19/17736* (2020.01)

(52) U.S. Cl.
CPC ......... *H03K 19/17748* (2013.01); *G06F 1/10* (2013.01); *G06F 8/40* (2013.01); *H03K 19/17736* (2013.01)

(58) Field of Classification Search
None
See application file for complete search history.

(56) References Cited

U.S. PATENT DOCUMENTS

| 6,191,612 | B1 | 2/2001 | Agrawal et al. |
| 7,504,851 | B2 | 3/2009 | Manohar et al. |
| 7,610,567 | B2 | 10/2009 | Manohar |
| 7,733,123 | B1 | 6/2010 | Young et al. |
| 7,739,628 | B2 | 6/2010 | Manohar et al. |
| 7,746,102 | B1 | 6/2010 | Young et al. |
| 7,746,103 | B1 | 6/2010 | Gaide et al. |
| 7,746,104 | B1 | 6/2010 | Gaide et al. |
| 7,746,105 | B1 | 6/2010 | Gaide et al. |
| 7,746,106 | B1 | 6/2010 | Gaide et al. |
| 7,746,108 | B1 | 6/2010 | Young et al. |
| 7,746,109 | B1 | 6/2010 | Young et al. |
| 7,746,110 | B1 | 6/2010 | Gaide et al. |
| 7,746,111 | B1 | 6/2010 | Gaide et al. |
| 7,746,112 | B1 | 6/2010 | Gaide et al. |
| 7,900,078 | B1 | 3/2011 | Manohar et al. |
| 7,948,265 | B1 | 5/2011 | Young et al. |

(Continued)

OTHER PUBLICATIONS

Hatem, et al., "A LOw-Area Asynhronous Router for Clock-Less Network-on-Chip on a FPGA", The University of Nottingham, Malaysia Campus, 2013 IEEE Symposium on Computers & Informatics.

*Primary Examiner* — Jany Richardson

(74) *Attorney, Agent, or Firm* — Patterson + Sheridan, LLP

(57) ABSTRACT

An example integrated circuit includes an array of circuit tiles; interconnect coupling the circuit tiles in the array, the interconnect including interconnect tiles each having a plurality of connections that include at least a connection to a respective one of the circuit tiles and a connection to at least one other interconnect tile; and a plurality of local crossbars in each of the interconnect tiles, the plurality of local crossbars coupled to form a non-blocking crossbar, each of the plurality of local crossbars including handshaking circuitry for asynchronous communication.

20 Claims, 8 Drawing Sheets

(56) References Cited

U.S. PATENT DOCUMENTS

| | | |
|---|---|---|
| 7,982,502 B2 | 7/2011 | Manohar et al. |
| 8,185,720 B1 | 5/2012 | Ansari et al. |
| 8,191,019 B2 | 5/2012 | Manohar et al. |
| 8,300,635 B2 | 10/2012 | Ekanayake et al. |
| 8,301,933 B2 | 10/2012 | Manohar et al. |
| 8,375,339 B2 | 2/2013 | Manohar |
| 8,527,572 B1 | 9/2013 | Young et al. |
| 8,773,164 B1 | 7/2014 | Gaide et al. |
| 8,773,166 B1 | 7/2014 | Gaide et al. |
| 8,964,795 B2 | 2/2015 | Manohar et al. |
| 9,002,915 B1 | 4/2015 | Young et al. |
| 9,411,554 B1 | 8/2016 | Young et al. |
| 9,438,244 B2 | 9/2016 | Sood et al. |
| 9,509,307 B1 | 11/2016 | Santurkar et al. |
| 11,113,030 B1 * | 9/2021 | Monga ..................... G06F 8/10 |
| 11,159,381 B2 * | 10/2021 | O'Brien ................. H04L 45/18 |
| 2011/0062991 A1 | 3/2011 | Manohar et al. |
| 2011/0307433 A1 * | 12/2011 | Dlugosch .......... G06F 15/17312 |
| | | 706/45 |

* cited by examiner

COMPUTE DATAFLOW ARCHITECTURE

CROSS-REFERENCE TO RELATED APPLICATIONS

This Application is a divisional of U.S. application Ser. No. 16/857,090, filed Apr. 23, 2020, which is incorporated herein by reference in its entirety.

TECHNICAL FIELD

Examples of the present disclosure generally relate to electronic circuits and, in particular, to a compute dataflow architecture for programmable devices.

BACKGROUND

Programmable devices (e.g., integrated circuits containing programmable logic) include networks for transferring data between different configurable logic elements (CLE). Synchronous networks can transfer data between two endpoints each clock cycle. However, the frequency of these transfers is limited to the clock speed and placement of the CLEs. Further, the network may include multiple interconnects (also referred to as interconnect tiles or switching elements) which can be used to perform pipelining. The clock speeds in integrated circuit has not increased as rapidly in previous generations, but highly pipelined designs can increase throughput despite slow circuitry. However, with synchronous networks, pipeline stages in parallel paths must match each other in order to maintain functional correctness, but because clock jitter, clock skew, flip flop setup/clock-to-out overhead, imperfect flip flop timing location, pipelining is difficult to achieve in a synchronous network.

One solution is to use asynchronous networks to transfer data between the CLEs in the programmable logic which overcomes the limitations of pipelining in a synchronous network. That is, asynchronous networks can have different parallel paths with different lengths and still perform pipelining. Further, asynchronous networks are not dependent on clock jitter or different clock domains. However, asynchronous networks have disadvantages relative to synchronous networks such as requiring handshaking and enabling fan-out.

SUMMARY

In another example, an operation that is part of a method, computer readable storage medium and a system includes receiving source code to be implemented in an integrated circuit comprising an array of circuit tiles that are communicatively coupled using programmable interconnects and a plurality of interconnect tiles, converting the source code into a flow control graph, converting the flow control graph into a primitive graph comprising a plurality of predefined primitives where each of the predefined primitives includes circuitry for performing at least a portion of an operation defined in the flow control graph, mapping the predefined primitives in the primitive graph to the plurality of circuit tiles where the plurality of circuit tiles each includes at least a multiplier and circuitry for performing one additional logical function that can be programmatically selected, and connecting the plurality of circuit tiles using the plurality of interconnect tiles, thereby implementing the source code in the integrated circuit.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
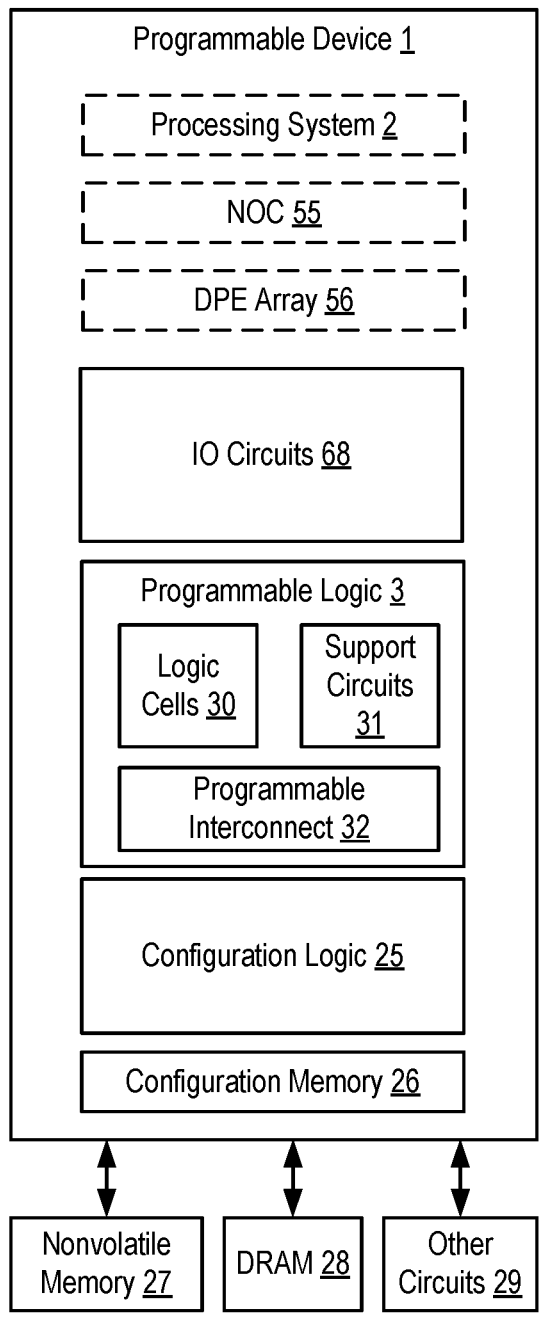
FIG. 1A is a block diagram depicting a programmable IC according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1A is a block diagram depicting a programmable IC 1 according to an example. The programmable IC 1 includes programmable logic 3 (also referred to as a programmable fabric), configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like. In some examples, the programmable IC 1 includes a network-on-chip (NOC) 55 and data processing engine (DPE) array 56. The NOC 55 is configured to provide for communication between subsystems of the programmable IC 1, such as between the PS 2, the PL 3, and the DPE array 56. The DPE array 56 can include an array of DPE's configured to perform data processing, such as an array of vector processors.

Figure 1B:
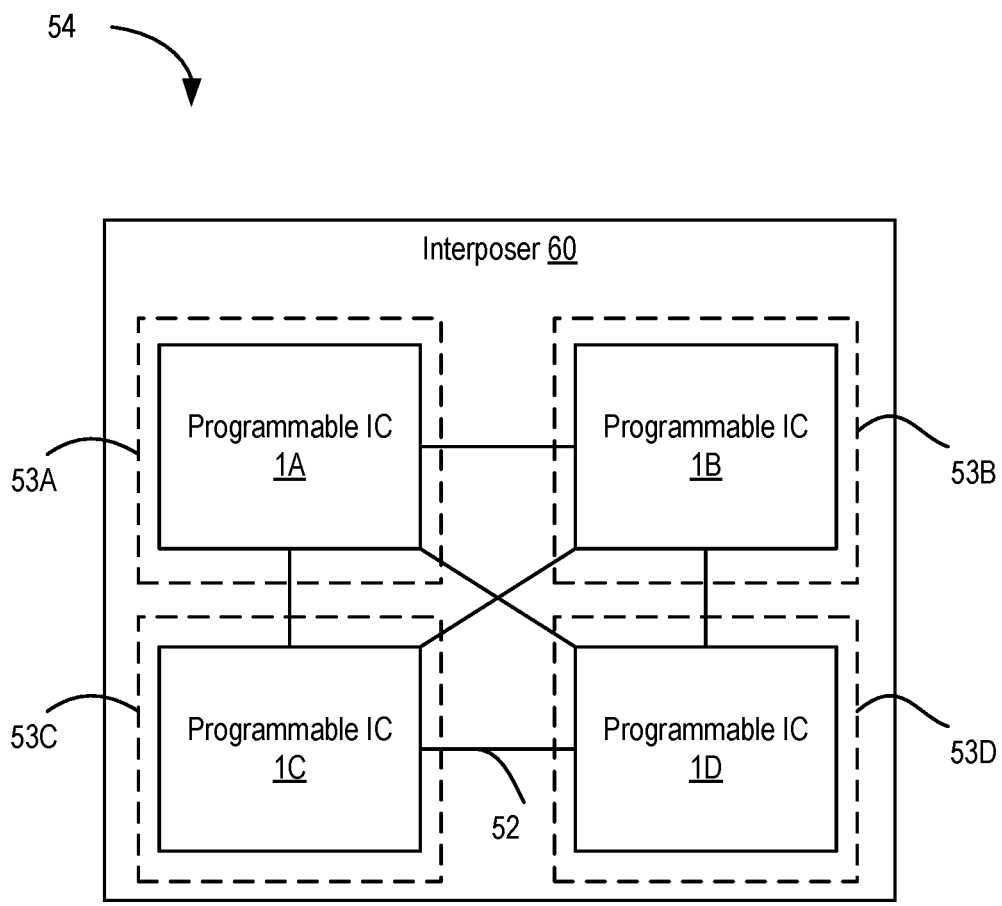
FIG. 1B is a block diagram depicting a programmable device according to an example.

FIG. 1B is a block diagram depicting a programmable device 54 according to an example. The programmable device 54 includes a plurality of programmable integrated circuits (ICs) 1, e.g., programmable ICs 1A, 1B, 1C, and 1D. In an example, each programmable IC 1 is an IC die disposed on an interposer 60. Each programmable IC 1 comprises a super logic region (SLR) 53 of the programmable device 54, e.g., SLRs 53A, 53B, 53C, and 53D. The programmable ICs 1 are interconnected through conductors on the interposer 60 (referred to as super long lines (SLLs) 52).

Figure 1C:
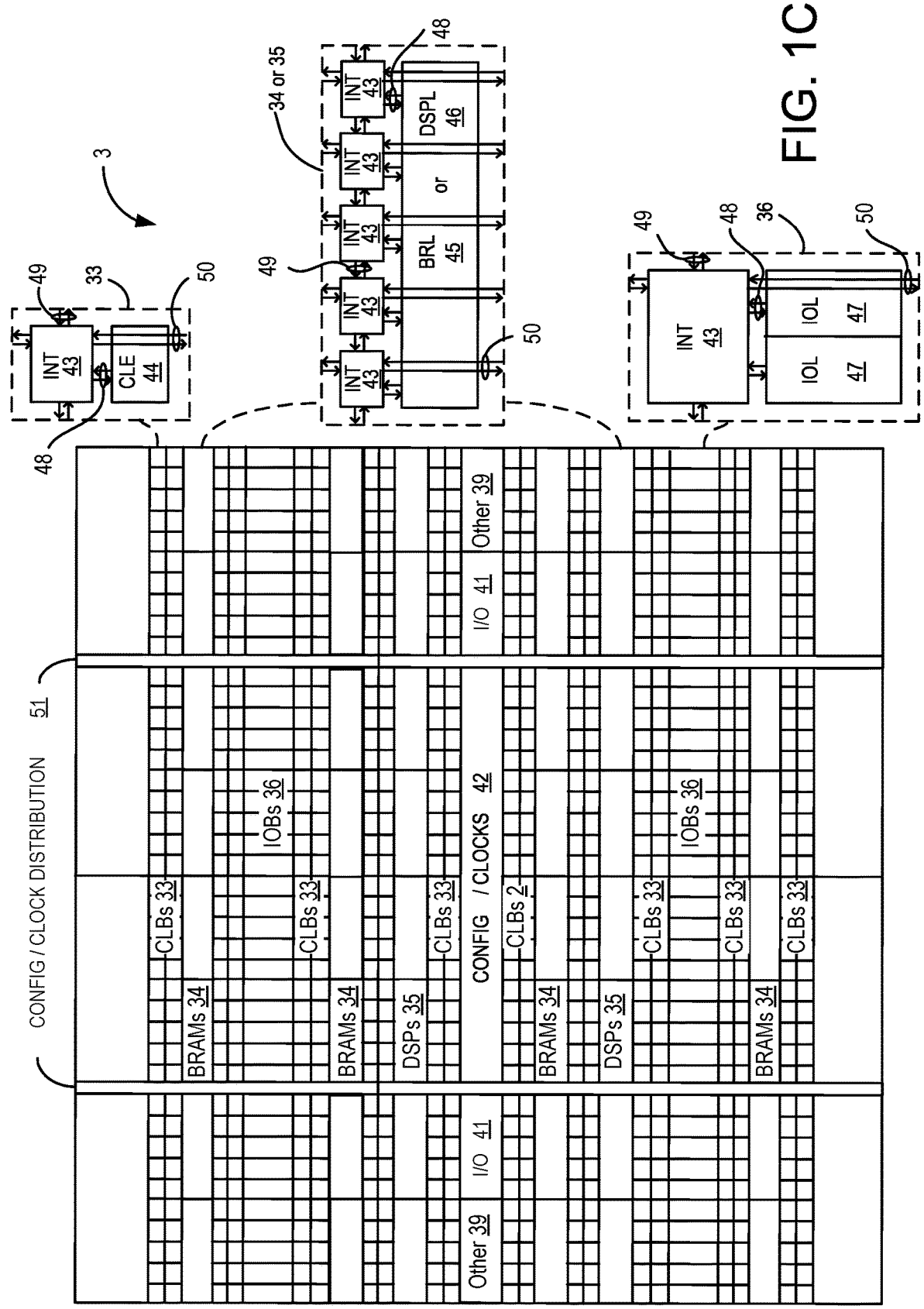
FIG. 1C illustrates a field programmable gate array (FPGA) implementation of the programmable IC according to an example.

FIG. 1C illustrates a field programmable gate array (FPGA) implementation of the programmable IC 1 that includes the PL 3. The PL 3 shown in FIG. 1C can be used in any example of the programmable devices described herein. The PL 3 includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The PL 3 can also include PCIe interfaces 40, analog-to-digital converters (ADC) 38, and the like.

In some PLs, each programmable tile can include at least one programmable interconnect element ("INT") 43 having connections to input and output terminals 48 of a programmable logic element within the same tile, as shown by examples included at the top of FIG. 1C. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated PL.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 3D) is used for configuration, clock, and other control logic. Vertical columns 51 extending from this horizontal area or column are used to distribute the clocks and configuration signals across the breadth of the PL.

Some PLs utilizing the architecture illustrated in FIG. 1C include additional logic blocks that disrupt the regular columnar structure making up a large part of the PL. The additional logic blocks can be programmable blocks and/or dedicated logic.

Note that FIG. 1C is intended to illustrate only an exemplary PL architecture. For example, the numbers of logic blocks in a row, the relative width of the rows, the number and order of rows, the types of logic blocks included in the rows, the relative sizes of the logic blocks, and the interconnect/logic implementations included at the top of FIG. 1C are purely exemplary. For example, in an actual PL more than one adjacent row of CLBs is typically included wherever the CLBs appear, to facilitate the efficient implementation of user logic, but the number of adjacent CLB rows varies with the overall size of the PL.

The programmable interconnect 32 described above is coupled to the various circuit tiles in the programmable logic 3. The programmable interconnect 32 (also referred to as interconnect) can be programed using the configuration memory 26 to connect different circuit tiles together to form a circuit in the programmable logic 3. One type of interconnect 32 is a pipelined synchronous interconnect. However, for a large device, a highly pipelined synchronous interconnect would have a large number of registers, consuming too much area and power. Further, there would be large latency of signals flowing through many sequential registers. In addition, clock enable (CE) timing would be problematic at high frequency. Finally, the software tools that generate the data to program the interconnect would need to guarantee matched cycle counts on parallel paths, requiring optional registers, extra first-in-first-out (FIFO)s, and tool support for those components.

In an example, the interconnect 32 is asynchronous. A highly pipelined asynchronous interconnect avoids most of the issues discussed above associated with a synchronous interconnect. Circuits only switch when the data dictates that the circuits switch. There are no clocks or clock enables. Asynchronous handshaking functions as a fine-grained clock and clock enable. Parallel paths do not need to match the number of stages. When there is no pushback, the data flows through open gates quickly, minimizing latency. The asynchronous interconnect 32 can operate as fast as the silicon, voltage, and temperature allows, rather than guaranteed worst case of synchronous. This is advantageous for compute applications and compatible with temperature dependent voltage scaling in the device.

Figure 2:
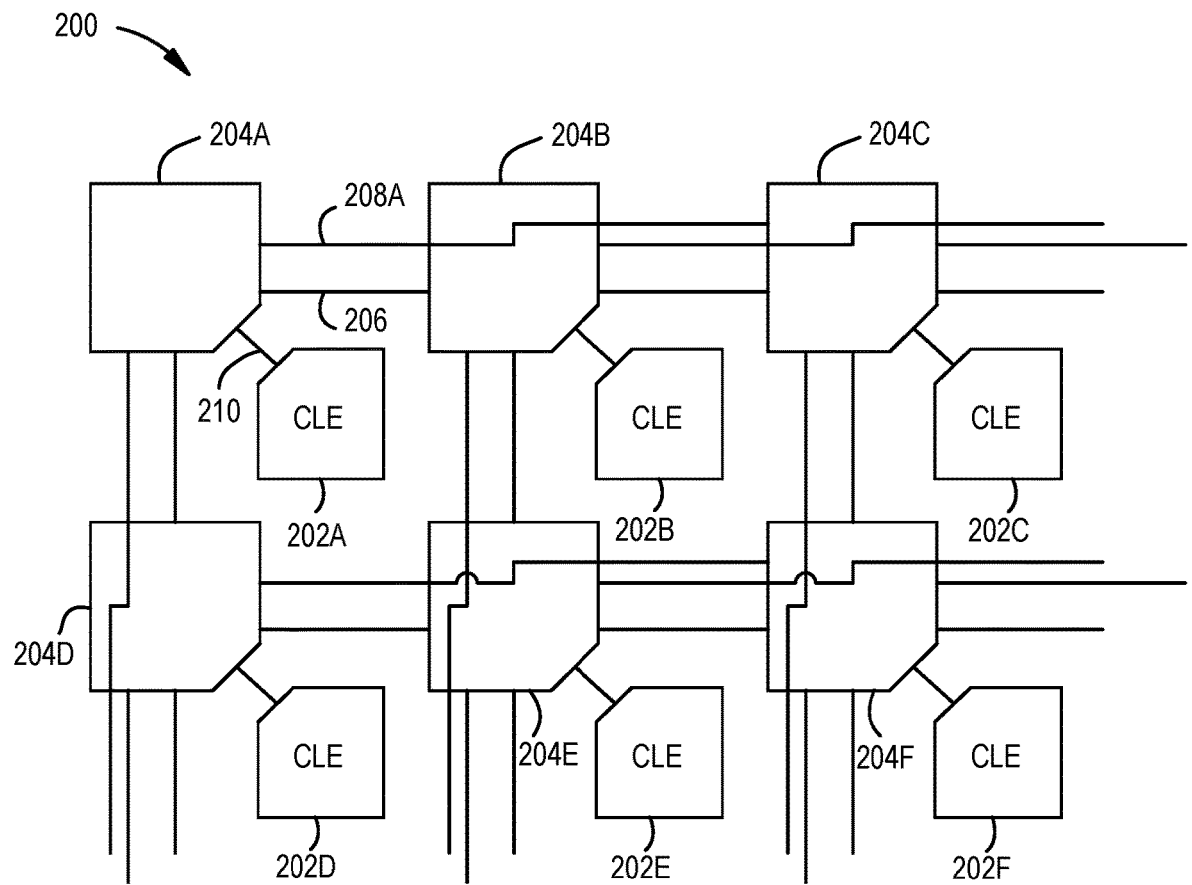
FIG. 2 is a block diagram depicting a portion of programmable logic according to an example.

FIG. 2 is a block diagram depicting a portion 200 of the programmable logic 3 according to an example. The programmable logic 3 includes an array of circuit tiles, e.g., CLEs 202A-F (collectively referred to as CLEs 202). As noted above, the programmable logic 3 can include different types of circuit tiles other than CLEs, but for purposes of clarity by example, CLEs 202 are shown. The interconnect 32 includes interconnect tiles 204A-F (collectively referred to as interconnect tiles 204). Each CLE 202 is coupled to an interface of an interconnect tile 204. Each interconnect tile 204 includes additional interfaces to other interconnect tiles 204. In the example shown, the connections between interconnect tiles 204 includes single connections 206 and double connections 208. The connections further include a connection 210 to a CLE 202. Single connections 206 connect adjacent interconnect tiles 204. Double connections 208 connect one interconnect tile 204 to another non-adjacent interconnect tile 204 having one interconnect tile 204 therebetween.

Each connection 206, 208, 210 includes a plurality of N-bit busses. For example, single connections 206 can include two 4-bit busses in each direction between interconnect tiles 204. Likewise, double connections 208 can include two 4-bit busses in each direction between respective interconnect tiles 204. In such case, there are 2×2×4=16 wires between two adjacent interconnect tiles 204 to implement a single connection 206. Likewise, there are 2×2×2×4=32 wires for transmitting data signal between two adjacent interconnect tiles 204 (assuming non-edge cases) to implement the two double connections 208 that are disposed between them. Each bus may also have Ready and Acknowledge handshaking signals, which adds two more wires for each 4-bit bus, which results in 48 total wires extending between two adjacent interconnect tiles 205. In an example, the connection 210 between an interconnect tile 204 and a CLE 202 includes three 4-bit busses into the CLE 202, and two 4-bit busses out of the CLE 202. In such cases, there are 3×2×4=24 wires between an interconnect tile 204 and a CLE 202. Those skilled in the art will appreciate that the number of busses and width N of the busses implementing the single connections 206, the double connections 208, and the connections 210 to the CLEs 202 can vary from the examples described herein.

In one embodiment, the interconnect tiles 204 in the portion 200 form an asynchronous network for transferring data between the CLEs 202. In one embodiment, the interconnect tiles 204 form pipelines between the CLEs 202. For example, each interconnect tile 204 can serve as a stage in a pipeline. Alternatively or additionally, each interconnect tile 204 can have multiple (internal) stages in the pipeline. Rather than using a clock signal, the stages in the pipeline can use a handshaking protocol to transfer data. For example, if the CLE 202A in the top left of FIG. 2 has data that should be transferred to the CLE 202F in the bottom right, the interconnect tiles 204A, B, C, and F can form a pipeline to transfer the data. That is, a first data chunk is transferred from the CLE 202A to the interconnect tile 204A. Using the handshaking protocol, the interconnect tile 204A transfers the first data chunk to the interconnect tile 204B. In parallel, the CLE 202A can transfer a second data chunk to the interconnect tile 204A. Again using the handshaking protocol, the interconnect tile 204B can transfer the first data chunk to the interconnect tile 204C while the interconnect tile 204A transfers the second data chunk to the interconnect tile 204B and the CLE 202A transfers a third data chunk to the interconnect tile 204A. The first data chunk can then be transferred from the interconnect tile 204C to the interconnect tile 204F while the second and third data chunks also advance in the pipeline and the CLE 202A transfers a fourth data chunk to the interconnect tile 204A. The first data chunk is then transferred to the CLE 202F. In this manner, multiple chunks can be propagating through the stages of the pipeline formed using the interconnect tiles 204. Further, the transfer of data is asynchronous and does not rely on a shared clock but rather on handshaking signals indicating when the stages are ready to transfer data. Moreover, while this example describes using the interconnect tiles 204 as stages, as described below, the interconnect tiles 204 themselves can form multiple internals stages of the pipeline.

Figure 3:
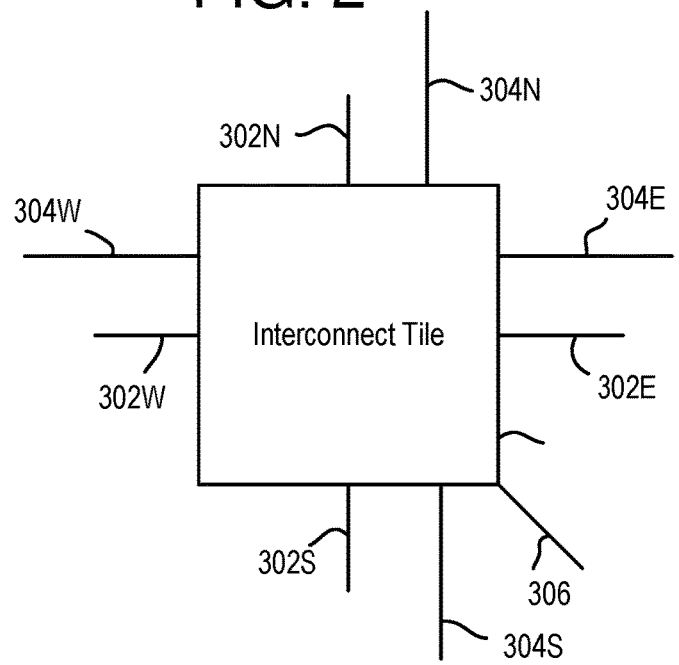
FIG. 3 is a block diagram depicting an interconnect tile according to an example.

FIG. 3 is a block diagram depicting an interconnect tile 204 according to an example. In the example, the interconnect tile 204 includes single connections 302N, 302E, 302S, and 302W to the north, east, south, and west adjacent interconnect tiles 204, respectively. The interconnect tile 204 includes double connections 304N, 304E, 304S, and 304W to the north, east, south, and west non-adjacent interconnect tiles 204, respectively. The interconnect tile 204 includes a CLE connection 306 to a respective CLE. The interconnect tile 204 shown in FIG. 3 is for the non-edge case. Those skilled in the art will appreciate that interconnect tiles on the edge have less than all of the N, E, S, and W connections as there may be no further tiles in some directions at the edge.

Figure 4:
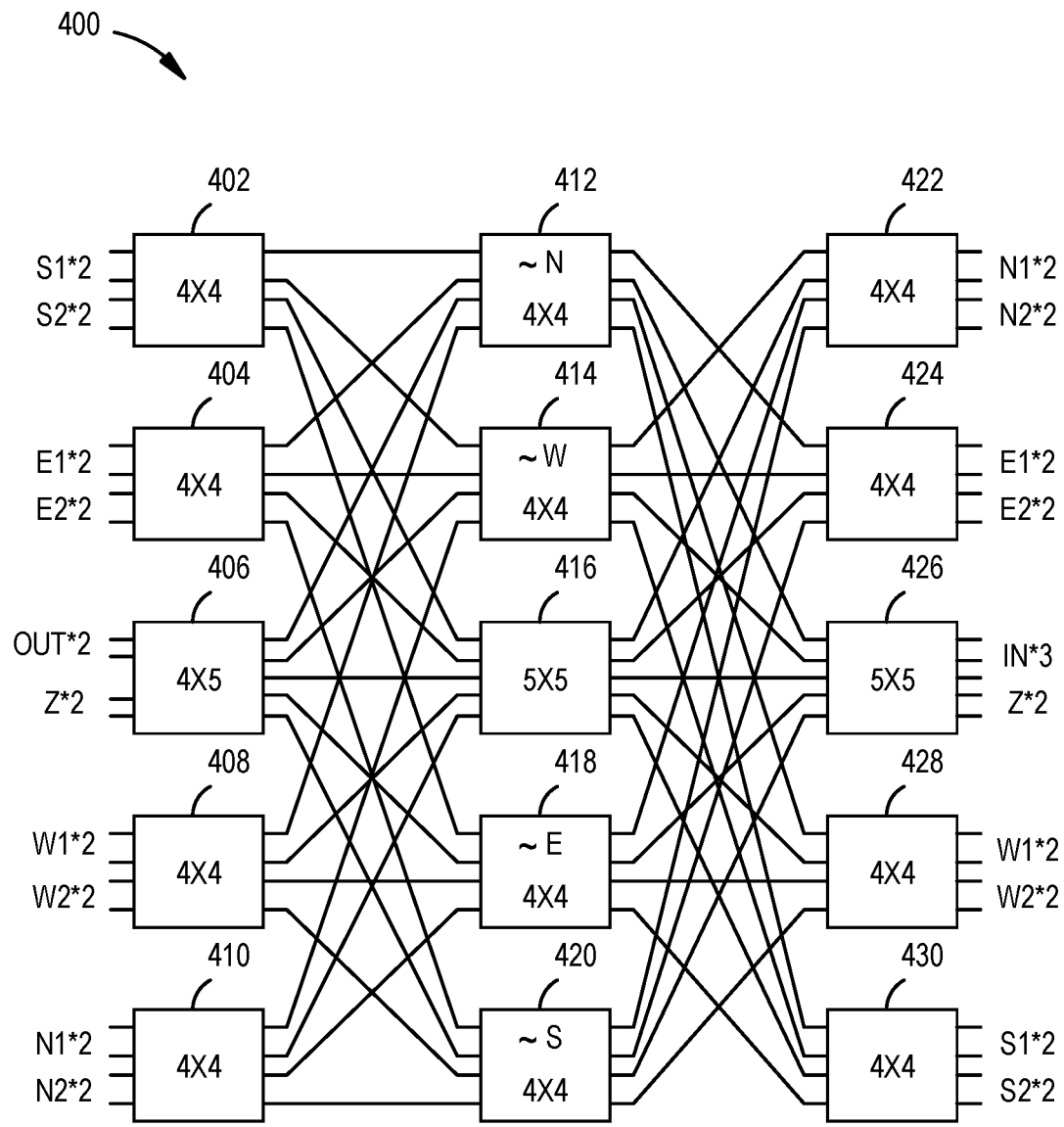
FIG. 4 is a block diagram depicting a full non-blocking crossbar to implement an interconnect tile according to an example.

FIG. 4 is a block diagram depicting a non-blocking crossbar 400 to implement an interconnect tile 204 according to an example. That is, the non-blocking crossbar 400 is one implementation of the circuitry that may be used to implement the interconnect tiles 204 in FIGS. 2 and 3. In one embodiment, the crossbar 400 is "non-blocking" because any set of signals that are received at the same time on the busses on the left can be routed to the busses on the right successfully (without a conflict). That is, the crossbar 400 can receive any set of signals simultaneously which can be routed through the crossbar 400 successfully, although the crossbar 400 may have to re-arrange the manner in which it routes the signals to arrive at a non-blocking solution.

The non-blocking crossbar 400 is formed from local crossbars 402-430 (which can also be referred to as switch-boxes). In the example, assume two busses in both directions for the single connections 206, and two busses in both directions for the double connections 208. In such case, there are four busses coming from each of the N, S, E, and W directions for each direction. In particular, from the south, there are two busses S1 and two busses S2; from the north there are two busses N1 and two busses N2; from the east there are two busses E1 and two busses E2; from the west there are two busses W1 and two busses W2. Further, in this example, there are three input busses (In) to a CLE, and two output busses (Out) from the CLE. Further, in the present example, there is one 4-bit bus up and down in the Z direction to support communication between stacked die layers. The local crossbars 402-430 are connected in a manner to function as a non-blocking crossbar. A non-blocking crossbar allows the software tools to greatly reduce runtime by simplifying the model of the device. One reason the software tools can reduce runtime is that software algorithms that operate on the more global scale can assume that the local routing problem is solvable and not have to worry about the detailed connections at the local level. In other words the details can be abstracted away, and all of the local routing problems can be solved quickly in parallel in a later stage. Using smaller local crossbars as the building blocks allows the acknowledge handshaking circuitry to be efficiently implemented locally, enabling fan out in the programmable interconnect (which is discussed later).

In an example, the number of connections between local crossbars 402-430 is reduced with respect to the number that normally exists in a full non-blocking crossbar implementation. That is, a full non-blocking crossbar would include connections that permit a signal to reverse and proceed in the direction it came from. For example, if a signal arrived from the south direction, a full non-blocking crossbar can route that signal back out in the south direction. However, for a full crossbar based routing network, there may be no reason why a signal should reverse directions, thus the non-blocking crossbar 400 shown in FIG. 4 does not have circuitry for reversing the signal's direction. That is, connections that needlessly reverse the direction of travel are omitted.

This reduces the implementation cost of the non-blocking crossbar 400 by approximately 20%, while maintaining the non-blocking nature of the crossbar. The effects of removing circuitry for reversing the direction can be seen in the left column where the local crossbar 402 receives four inputs (two buses in the south direction) and has only four outputs to the middle column. Notably, the crossbar 402 does not connect to the local crossbar 420 (labeled ~S or NOT SOUTH indicating this crossbar does not connect to the local crossbars 402 and 430 that are coupled to busses extending in the south direction). Using the other four crossbars in the middle column (i.e., the local crossbars 412, 414, 416, and 418), the local crossbar 402 can transfer data in the N, E, and W directions. Similarly, the local crossbars 404 and 424 coupled to the busses extending in the East direction are not connected to the local crossbar 418 (labeled ~E), the local crossbars 408 and 428 coupled to the busses extending in the West direction are not connected to the local crossbar 414 (labeled ~W), and the local crossbars 410 and 422 coupled to the local busses extending in the North direction are not connected to the local crossbar 412 (labeled ~N). This reduces the complexity of the circuitry while still maintaining the non-blocking aspect of the crossbar 400 in the relevant directions—e.g., a south-bound signal can be routed N, E, and W, a north-bound signal can be routed E, W, and S, an east-bound signal can be routed N, W, and S, and a west-bound signal can be routed N, S, and E.

In the example, the local crossbar 402 is coupled to S1 and S2 on one side, and coupled to each of the local crossbars 412, 414, 416, and 418 on the other side. The local crossbar 404 is coupled to E1 and E2 on one side, and coupled to each of the local crossbars 412, 414, 416, and 420 on the other side. The local crossbar 408 is coupled to receive W1 and W2 on one side, and coupled to each of the local crossbars 412, 416, 418, and 420 on the other side. The local crossbar 402 is coupled to receive N1 and N2 on one side, and coupled to each of the local crossbars 414, 416, 418, and 420 on the other side. Each of the local crossbars 402, 404, 408, and 410 are 4×4 crossbars rather than 4×5 crossbars since they do not have to be able to reverse directions as discussed above.

In the example, the local crossbar 430 is coupled to S1 and S2 on one side, and coupled to each of the local crossbars 412, 414, 416, and 418 on the other side. The local crossbar 424 is coupled to E1 and E2 on one side, and coupled to each of the local crossbars 412, 414, 416, and 420 on the other side. The local crossbar 428 is coupled to receive W1 and W2 on one side, and coupled to each of the local crossbars 412, 416, 418, and 420 on the other side. The local crossbar 422 is coupled to receive N1 and N2 on one side, and coupled to each of the local crossbars 414, 416, 418, and 420 on the other side. Each of the local crossbars 422, 424, 428, and 430 are 4×4 crossbars.

The local crossbar 406 is coupled to Out and Z on one side, and coupled to each of the local crossbars 412-420 on the other side. In the example, the local crossbar 406 is a 4×5 crossbar rather than a 4×4 crossbar to enable the Out signal (which is connected to the CLE) to reverse directions to feed back into the CLE using an In signal (also connected to the CLE). However, if the data from the CLE does not need to reverse directions, the local crossbar 406 could be a 4×4 crossbar. The local crossbar 426 is coupled to In and Z on one side, and coupled to each of the local crossbars 412-420 on the other side. The Z bus is used if the programmable device (e.g., integrated circuit) is stacked with other programmable devices on other integrated circuits. That is, the Z bus permits the interconnect tile in a first programmable device to communicate with an interconnect tile in a second programmable device (in a Z direction rather than the north, east, south, and west directions which extend in the X and Y directions). However, if the programmable device is not stacked (e.g., bonded) with other programmable devices, the Z bus may be omitted. In the example, the local crossbar 426 is a 5×5 crossbar. Each of the local crossbars 412, 414, 418, and 420 are 4×4 crossbars. The local crossbar 416 is a 5×5 crossbar.

In addition, the circuitry of the local crossbars can be further reduced by eliminating the flexibility to choose between identical wires. In FIG. 4, there are 4×4 switchboxes in the first and last column servicing each direction of bus. Since, for example, there are two East busses of length 1 the routing does not care which of these two identical busses are used by a given routed signal. As a result, the local crossbars can be configured to route all combinations of signals through the local crossbars but those signals are routed only to arbitrary output pins rather than all output pin permutations. In one embodiment, the 4×4 switchboxes can be reduced to two 2×2 switchboxes at either the first or last column (but not both) to remove this bit of flexibility.

Figure 5:
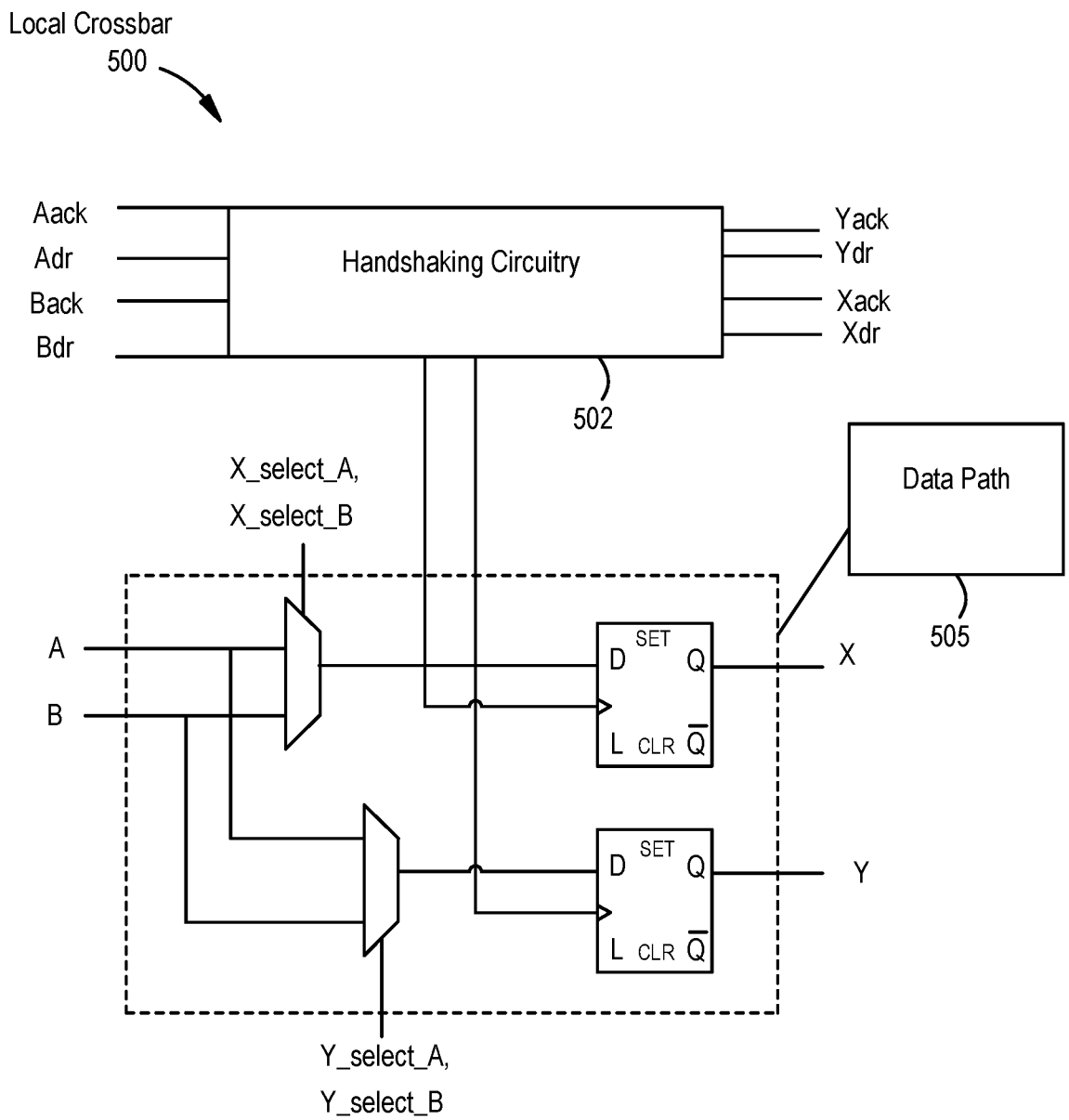
FIG. 5 is a block diagram depicting a local crossbar according to an example.

FIG. 5 is a block diagram depicting a local crossbar 500 according to an example. The local crossbar 500 is a 2×2 crossbar but the 4×5, 5×4, and 5×5 local crossbars illustrated in FIG. 4 can have a similar structure. The local crossbar 500 incudes handshaking circuitry 502 that provides for asynchronous communication between inputs and outputs of the local crossbar 500. The asynchronous communication generally includes data signals and control signals for acknowledgement. As shown, the handshaking circuitry 502 includes acknowledge signals (i.e., Aack, Back, Xack, and Yack) for the data signals A, B, X, and Y in the data path 505. In one embodiment, the A and B signals may be the input into the local crossbar 500 while the X and Y signals are the outputs. For example, the A signal may be a first bit in a first bus received at the local crossbar 500 while the B signal may be a first bit in a second bus received at the local crossbar 500. Although not shown, the local crossbar 500 can have multiple copies of the data path 505 depending on the width of the two busses. For example, if the two busses are four-bit busses, the local crossbar has four copies of the data path 505, one copy for each bit in the buses.

The handshaking circuitry 502 permits fan-out where one signal can "fan out" to multiple inputs. For example, the A signal can be outputted on the X output, the Y output, or both the X and Y outputs. Permitting the A signal to fan out so that it can be outputted on both the X and Y outputs simultaneously requires the handshaking circuitry 502 to determine that the data inputted at A is received at both the X and Y outputs. To do so, the handshaking circuitry 502 may include C-elements and muxing to enable asynchronous handshaking when input signals fan out to multiple output signals. Referring to the local crossbars in FIG. 4, the handshaking circuitry in those crossbars permits one of the inputs to fan out to some or all of the outputs simultaneously (e.g., 2, 3, 4, or 5 of the outputs depending on the number of outputs in the local crossbar). In one embodiment, the fanout in these small, local crossbars is very localized, allowing the local circuitry to easily implement the acknowledge signal as shown in the example of FIG. 5. If the fanout is not localized (e.g., extends to circuitry far away from each other), generating the acknowledge is be very expensive and may be impractical because many wires would need to travel back from each of the fanout locations. Thus, localizing fanouts in the local crossbars improves the performance and cost of the apparatus.

In one embodiment, in the local crossbar illustrated in FIG. 5, the X_select_A, Y_select_A, X_select_B, Y_select_B are all signals from configuration memory cells, which is consistent with general FPGA routing architectures. In other words, the choice of which signals to route through the muxes is not continuously dynamic but rather dependent on memory cell values.

In an example, the CLEs implement a set of building blocks designed to support intermediate primitives of a high-level programming language, such as C or C++. Contrast this with conventional FPGAs that have lookup tables (LUTs) and flip-flops to support random logic described using a hardware description language (HDL). That is, current solutions convert compiled source code of a programming language into interconnected LUTs and flip-flops since these circuits can be used to express essentially any logical construct that can also be expressed in source code. However, it requires a large amount of time to synthesize source code into a design for programmable logic containing LUTs and flip-flops. Further, the synthesis process requires considering routing constraints and timing issues. Further, the storage elements in the local crossbar could either edge sensitive or level sensitive latches depending one, e.g., whether two phase or four phase handshaking is used. Both are possible and can be implemented with corresponding changes to the internal handshaking logic.

The embodiments below discuss using the intermediate primitives to map source code to CLEs that are interconnected using an asynchronous network (e.g., the interconnect tiles discussed above). Doing so can save time and compute resources relative to the traditional way of converting source code to register transfer level (RTL) code which is then used to configured the LUTs and flip-flops in the programmable logic.

Figure 6:
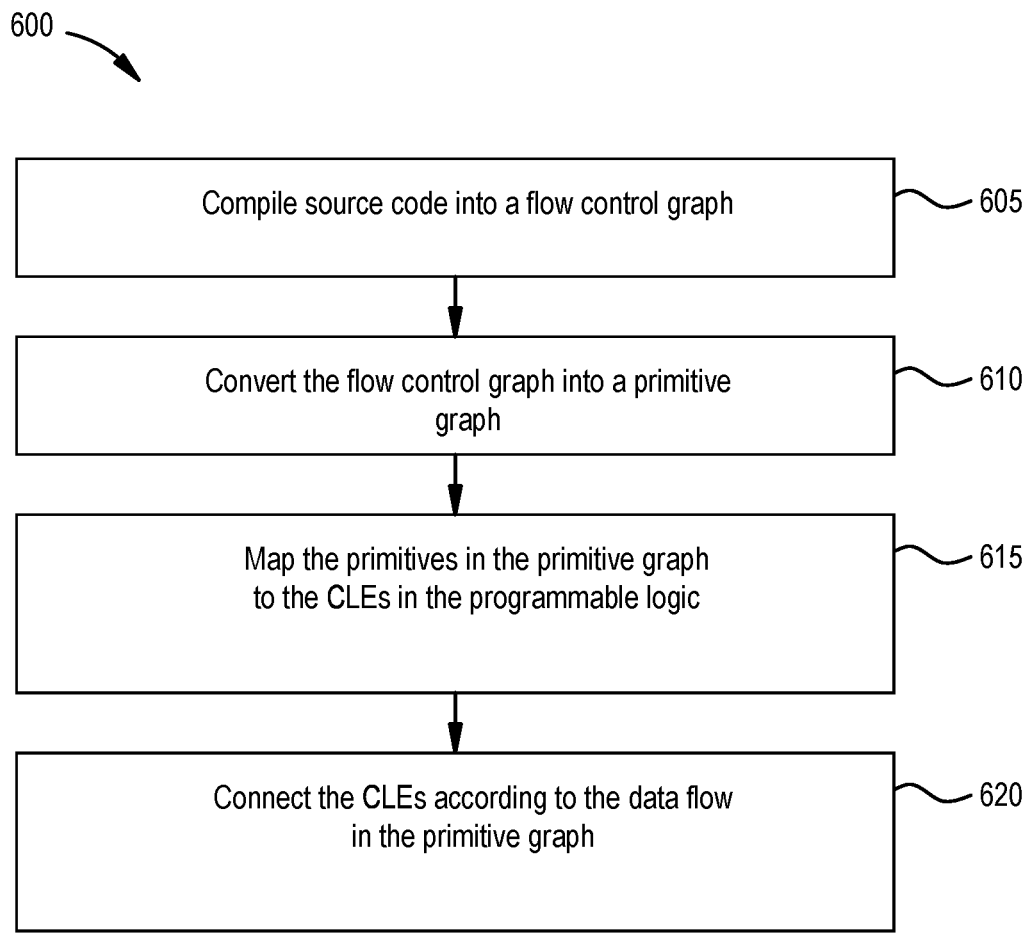
FIG. 6 is a flowchart for using intermediate primitives to configure programmable logic, according to an example.

FIG. 6 is a flowchart of a method 600 for using intermediate primitives to configure programmable logic, according to one embodiment described herein. At block 605, a compiler converts source code into a flow control graph. That is, a compiler maps source code developed using a high-level programming language (e.g., C, C++, and the like) into the flow control graph. The embodiments herein are not limited to any particular technique for converting the source code into the flow control graph.

In one embodiment, the flow control graph represents how data flows as defined by the operations in the source code. For example, the flow control graph can indicate whether there is data dependency between operations, or whether operations are independent of each other. Operations that are independent can execute in parallel in the flow control graph. In contrast, dependent operations may be connected in a chain since the output of one operation can affect the input of another operation.

Typically, when implementing the source code using programmable logic, a synthesizer converts the flow control graph into RTL which is in turn mapped to LUTs and flip-flops in the programmable logic. However, as mentioned above, this introduces many complexities in the synthesizing process such as timing constraints, routing and placement, and the like.

Instead of converting the flow control graph into RTL, at block 610, the synthesizer converts the flow control graph into a primitive graph formed using a predefined group of intermediate primitives. That is, the synthesizer can directly map operations in the source code (and the flow control graph) into the predefined intermediate primitives. For example, there may be an intermediate primitive for each type of operation that can be expressed in the source code.

Figure 7A:
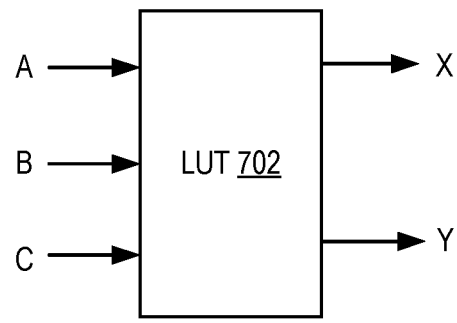
FIGS. 7A-7D are block diagrams showing different primitives that can be formed from a CLE according to an example.

FIGS. 7A-7D are block diagrams showing different intermediate primitives according to an example. FIG. 7A illustrates an intermediate primitive formed by a three input, two output LUT. Due to the flexibility of a LUT, they can perform many different source code operations. Stated differently, many different operations that can be defined using source code can be implemented in hardware using a LUT, such as any binary operation (e.g., bit-wise OR, AND, NOT, etc., or a bit-shift operation). Further, while the primitive in FIG. 7A could be a two input/two output LUT, a three input/two output LUT can perform two binary operations in parallel with the addition of only a small amount of circuitry relative to a two input/two output LUT.

Figure 7B:
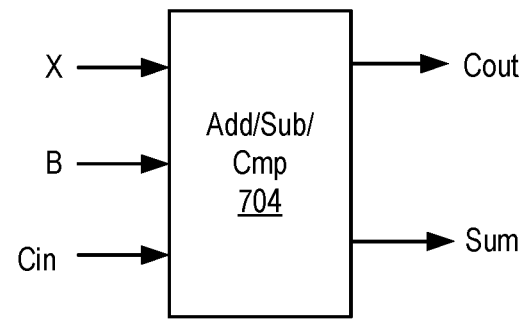

FIG. 7B illustrates an intermediate primitive for performing an add, multiply, or compare operation (i.e., addition, subtraction, and multiplication operations). That is, this intermediate primitive can map to add, multiply, or compare operations defined in the source code and the flow control graph.

Figure 7C:
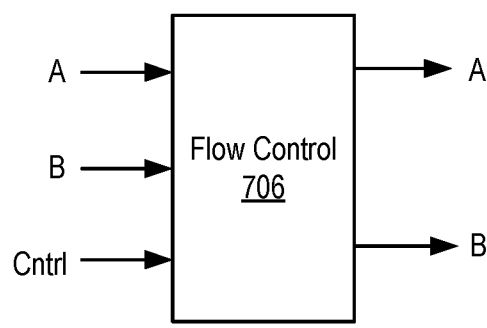

FIG. 7C illustrates a flow control primitive for performing flow control which can correspond to "if", "while", and "for" operations (or statements) in the source code. For example, for an "if" operation, the primitive in FIG. 7C can compare the inputs A and B and output a bit (0 or 1) indicating whether A and B are equal or not. This output can be fed into another flow control primitive as the CNTRL signal for selecting which of its inputs are outputted. Further, the flow control primitive in FIG. 7C may use token management and handshaking to perform the source code operations. In this manner, an if operation can be mapped to two (or more) of the flow control primitives. Loop operations such as a "while" or "for" operation can be mapped in a similar manner (but the number of flow control primitives mapped to the source code operation may vary).

Figure 7D:
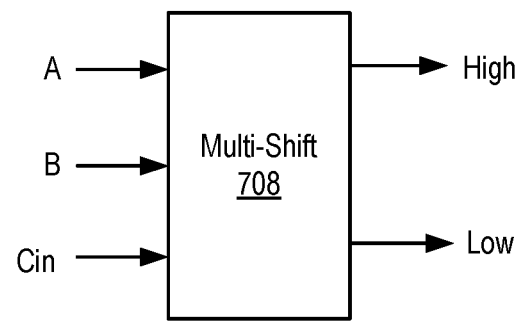

FIG. 7D illustrates an intermediate primitive for performing multi-shift operations. In one embodiment, a CLE 202 can include multiply block can also be used as a shifter since shifting is multiplying by a power of two. Reusing this block for shifting purposes may be more efficient assuming shifting is not a common operation. If shifting proves to be very common primitive, the CLE 202 may have a separate shift block that does a shift more efficiently than using a multiplier. For example, when using a multiple block there is an extra bit of logic to convert the shift value to its power of 2.

The intermediate primitives illustrated in FIGS. 7A-7D are just some of the examples of primitives that may be defined and mapped to source code operations. In one embodiment, each source code operation may be mapped to one (or multiple primitives). For example, it may require several flow control primitives to perform an if operation or a loop operation defined in the source code. However, in another embodiments, some source code operations may not have predefined primitives, or some operations may be mapped to the same type of primitive (e.g., a multiply and a shift operation in the source code can both map to a multiply primitive). Further, there may be source code operations that cannot be mapped into a primitive. In that case, the corresponding portion of the flow control graph may be synthesized into programmable logic using previous techniques (e.g., converted into RTL rather than being mapped to intermediate primitives).

In one embodiment, the synthesizer identifies source code operations in the flow control graph that can be mapped to the predefined primitives. As mentioned above, one of the operations may be mapped to multiple ones of the primitives (in the case of "if" and "while" statements in source code. These primitives can then be interconnected to form the primitive graph much like the various signals in the flow control graph are connected. Thus, the primitive graph can represent the same logic as the flow control graph and the source code.

Returning to the method 600, at block 615 the synthesizer maps the intermediate primitives in the primitive graph to CLEs in the programmable logic. For example, each of the intermediate primitives in FIGS. 7A-7D can be directly mapped to one of the CLEs 202 illustrated in FIG. 2. That is, the CLEs 202 can be configured to perform the function defined by one of the primitives. In one embodiment, the CLEs 202 (e.g., circuit tiles) contain circuitry for performing different functions. In one embodiment, the CLEs 202 contain at least one multiplier and circuitry for performing at least one other logical function such as LUT, control flow, Add/Sub/Compare, and the like. The primitives programmatically determine which of the logical functions are selected in the CLEs 202. Thus, the CLEs 202 differ from fixed blocks that have a fixed logical function (i.e., where the logical function(s) performed by the blocks are not selectable).

Directly configuring the CLEs using the intermediate primitives avoids having to generate RTL and then place the RTLs at various locations in the programmable logic. Instead, the intermediate primitives are designed to map to one of the CLEs. As mentioned above, one operation may map to multiple primitives, in which case, that operation may be performed using multiple CLEs.

In one embodiment, the IC contains an array of CLEs as shown in FIG. 2. These CLEs are communicatively coupled by the interconnect tiles 204 and programmable connections 210 (e.g., programmable interconnects)—i.e., the lines extending between the interconnect tiles 204 and between the tiles 204 and the CLEs 202.

At block 620, the synthesizer connects the CLEs according to the flow of data in the primitive graph. That is, the selected CLEs can be connected using the asynchronous interconnect tiles illustrated in the figures above. For example, if the flow control graph included a 32 bit add operation, this operation could be divided into four add primitives (e.g., as shown in FIG. 7B) assuming these primitives have 8-bit buses. These four primitives can be mapped to four CLEs in the programmable logic and the interconnect tiles can be configured to transfer data between the CLEs (e.g., the carry lines and intermediate sums) to perform the 32 bit add operation. Because the interconnect tiles are asynchronous, the synthesizer does not have to consider timing constraints and different clock domains when selecting the CLEs and configuring the interconnect tiles to transfer data between the CLEs.

While the foregoing is directed to specific examples, other and further examples may be devised without departing from the basic scope thereof, and the scope thereof is determined by the claims that follow.

What is claimed is:

1. A method, comprising:
receiving source code to be implemented in an integrated circuit comprising an array of a plurality of circuit tiles that are communicatively coupled using programmable interconnects and a plurality of interconnect tiles;
converting the source code into a flow control graph;
converting the flow control graph into a primitive graph comprising a plurality of predefined primitives, wherein each of the predefined primitives includes circuitry for performing at least a portion of an operation defined in the flow control graph;
mapping the predefined primitives in the primitive graph to the plurality of circuit tiles, wherein the plurality of circuit tiles each comprises at least a multiplier and circuitry for performing one additional logical function that can be programmatically selected; and
connecting the plurality of circuit tiles using the plurality of interconnect tiles, thereby implementing the source code in the integrated circuit.

2. The method of claim 1, wherein converting the flow control graph into the primitive graph comprises:
mapping operations defined in the flow control graph to respective predefined primitives, and
connecting the predefined primitives.

3. The method of claim 1, wherein the predefined primitives in the primitive graph are mapped to the plurality of circuit tiles in a one-to-one manner.

4. The method of claim 1, wherein each of the plurality of circuit tiles comprises programmable logic that is configurable to implement any one of the plurality of predefined primitives.

5. The method of claim 1, wherein the plurality of interconnect tiles each has a plurality of connections that includes at least a first connection to a respective one of the plurality of circuit tiles and multiple connections to multiple other interconnect tiles.

6. The method of claim 5, wherein the plurality of interconnect tiles transfer data using asynchronous communication.

7. The method of claim 1, wherein the predefined primitives map to operations in the source code.

8. The method of claim 7, wherein the operations in the source code comprise at least one of an addition, subtraction, and multiplication operation.

9. The method of claim 7, wherein the operations in the source code comprise at least one of an if statement and a while statement.

10. The method of claim 9, wherein a single instance of the if statement or the while statement in the source code is converted to multiple predefined primitives that are mapped to multiple ones of the plurality of circuit tiles.

11. A non-transitory computer readable medium containing computer program code that, when executed by operation of one or more computer processors, performs an operation comprising: comprising:

receiving source code to be implemented in an integrated circuit comprising an array of a plurality of circuit tiles that are communicatively coupled using programmable interconnects and a plurality of interconnect tiles;

converting the source code into a flow control graph;

converting the flow control graph into a primitive graph comprising a plurality of predefined primitives, wherein each of the predefined primitives includes circuitry for performing at least a portion of an operation defined in the flow control graph;

mapping the predefined primitives in the primitive graph to the plurality of circuit tiles, wherein the plurality of circuit tiles each comprises at least a multiplier and circuitry for performing one additional logical function that can be programmatically selected; and connecting the plurality of circuit tiles using the plurality of interconnect tiles, thereby implementing the source code in the integrated circuit.

12. The non-transitory computer readable medium of claim 11, wherein converting the flow control graph into the primitive graph comprises:

mapping operations defined in the flow control graph to respective predefined primitives, and connecting the predefined primitives.

13. The non-transitory computer readable medium of claim 12, wherein the predefined primitives in the primitive graph are mapped to the plurality of circuit tiles in a one-to-one manner.

14. The non-transitory computer readable medium of claim 11, wherein each of the plurality of circuit tiles comprises programmable logic that is configurable to implement any one of the plurality of predefined primitives.

15. The non-transitory computer readable medium of claim 11, wherein the plurality of interconnect tiles each has a plurality of connections that includes at least a first connection to a respective one of the plurality of circuit tiles and multiple connections to multiple other interconnect tiles.

16. The non-transitory computer readable medium of claim 15, wherein the plurality of interconnect tiles transfer data using asynchronous communication.

17. The non-transitory computer readable medium of claim 11, wherein the predefined primitives map to operations in the source code.

18. The non-transitory computer readable medium of claim 17, wherein the operations in the source code comprise at least one of an addition, subtraction, and multiplication operation.

19. The non-transitory computer readable medium of claim 17, wherein the operations in the source code comprise at least one of an if statement and a while statement.

20. A system comprising:

a processor; and memory comprising computer program code that, when executed by operation of one or more computer processors, performs an operation comprising:

receiving source code to be implemented in an integrated circuit comprising an array of a plurality of circuit tiles that are communicatively coupled using programmable interconnects and a plurality of interconnect tiles;

converting the source code into a flow control graph;

converting the flow control graph into a primitive graph comprising a plurality of predefined primitives, wherein each of the predefined primitives includes circuitry for performing at least a portion of an operation defined in the flow control graph;

mapping the predefined primitives in the primitive graph to the plurality of circuit tiles, wherein the plurality of circuit tiles each comprises at least a multiplier and circuitry for performing one additional logical function that can be programmatically selected; and connecting the plurality of circuit tiles using the plurality of interconnect tiles, thereby implementing the source code in the integrated circuit.

\* \* \* \* \*